(12) United States Patent
Oka

(10) Patent No.: US 11,594,399 B2
(45) Date of Patent: Feb. 28, 2023

(54) CLEANING METHOD AND PLASMA PROCESSING APPARATUS

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/275,848

(22) Filed: Feb. 14, 2019

(65) Prior Publication Data

US 2019/0259578 A1 Aug. 22, 2019

(30) Foreign Application Priority Data

Feb. 16, 2018 (JP) .............................. JP2018-025594

(51) Int. Cl.
*H01J 37/32* (2006.01)
*B08B 7/00* (2006.01)

(52) U.S. Cl.
CPC ...... *H01J 37/32449* (2013.01); *B08B 7/0035* (2013.01); *H01J 37/32816* (2013.01); *H01J 37/32871* (2013.01)

(58) Field of Classification Search
None
See application file for complete search history.

(56) References Cited

U.S. PATENT DOCUMENTS

| 2014/0053867 | A1* | 2/2014 | Fang | .................. | H01J 37/32357 |
| | | | | | 134/1.1 |
| 2017/0282223 | A1* | 10/2017 | Coppa | .................... | B08B 7/0035 |
| 2017/0347442 | A1* | 11/2017 | Suzuki | .............. | H01J 37/32165 |
| 2018/0053661 | A1* | 2/2018 | Park | ....................... | H01J 37/321 |

FOREIGN PATENT DOCUMENTS

| JP | 09283494 | A | * | 10/1997 |
| JP | 2002-57149 | A | | 2/2002 |
| JP | 2005-243765 | A | | 9/2005 |
| JP | 2009-266884 | A | | 11/2009 |
| JP | 2011-054825 | A | | 3/2011 |
| TW | I656573 | B | | 4/2019 |

OTHER PUBLICATIONS

English Machine Translation of JP-09283494-A.*

* cited by examiner

*Primary Examiner* — Mikhail Kornakov
*Assistant Examiner* — Pradhuman Parihar
(74) *Attorney, Agent, or Firm* — Weihrouch IP

(57) ABSTRACT

A cleaning method removes a silicon oxide film by plasma from a member that is provided in a processing container of a plasma processing apparatus and having the silicon oxide film formed on its surface. The cleaning method includes: supplying a processing gas into the processing container; generating plasma of the processing gas that is supplied into the processing container; and applying bias power that draws ions in the plasma of the processing gas to the member. A ratio of a value of the bias power to a pressure in the processing container is 1.0 W/mTorr or less.

15 Claims, 6 Drawing Sheets

CLEANING METHOD AND PLASMA PROCESSING APPARATUS

CROSS-REFERENCE TO RELATED APPLICATIONS

This application is based on and claims priority from Japanese Patent Application No. 2018-025594 filed on Feb. 16, 2018 with the Japan Patent Office, the disclosure of which is incorporated herein in its entirety by reference.

TECHNICAL FIELD

Various aspects and embodiments of the present disclosure relate to a cleaning method and a plasma processing apparatus.

BACKGROUND

In a semiconductor manufacturing process, a plasma processing apparatus has been widely used to perform a plasma processing for the purpose of deposition or etching of a thin film. Examples of the plasma processing apparatus include a plasma chemical vapor deposition (CVD) apparatus for performing a thin film deposition processing and a plasma etching apparatus for performing an etching processing.

In such a plasma processing apparatus, it is important to protect a member provided in a processing container from plasma when various types of plasma processing are performed in the processing container. Therefore, a silicon oxide film serving as a protective film may be formed on a surface of the member provided in the processing container.

However, when various types of plasma processing are performed in the processing container, the silicon oxide film serving as the protective film is consumed by gas such as a fluorine-containing gas remaining in the processing container. Therefore, in the plasma processing apparatus, a cleaning processing that removes the silicon oxide film from the member provided in the processing container is regularly performed. The silicon oxide film is removed using, for example, plasma.

A method of drawing ions in plasma by controlling a pressure in a processing container has been proposed as a method of removing the silicon oxide film by plasma from a member provided in the processing container. See, for example, Japanese Patent Laid-Open Publication Nos. 2002-057149 and 2005-243765.

SUMMARY

In one embodiment, a cleaning method disclosed herein is a cleaning method including: supplying a processing gas into a processing container of a plasma processing apparatus including a member having a silicon oxide film formed on its surface; generating plasma of the processing gas that is supplied into the processing container; and applying bias power that draws ions in the plasma of the processing gas to the member. A ratio of a value of the bias power to a pressure in the processing container is 1.0 W/mTorr or less.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the cleaning method and the plasma processing apparatus disclosed herein will be described in detail with reference to drawings. Meanwhile, in the respective drawings, the same or corresponding parts will be denoted by the same symbols.

(Exemplary Configuration of Plasma Processing Apparatus)

An exemplary configuration of a plasma processing apparatus according to an embodiment will be described with reference to the drawings. The plasma processing apparatus according to the embodiment is a parallel plate type plasma processing apparatus (capacitively coupled plasma processing apparatus) in which a lower electrode and an upper electrode are arranged to face each other. Here, as the plasma processing apparatus, a plasma processing apparatus that performs etching of a film to be etched formed on a wafer by superimposing and applying a first radio-frequency power having a relatively high frequency of, for example, 40

Figure 1:
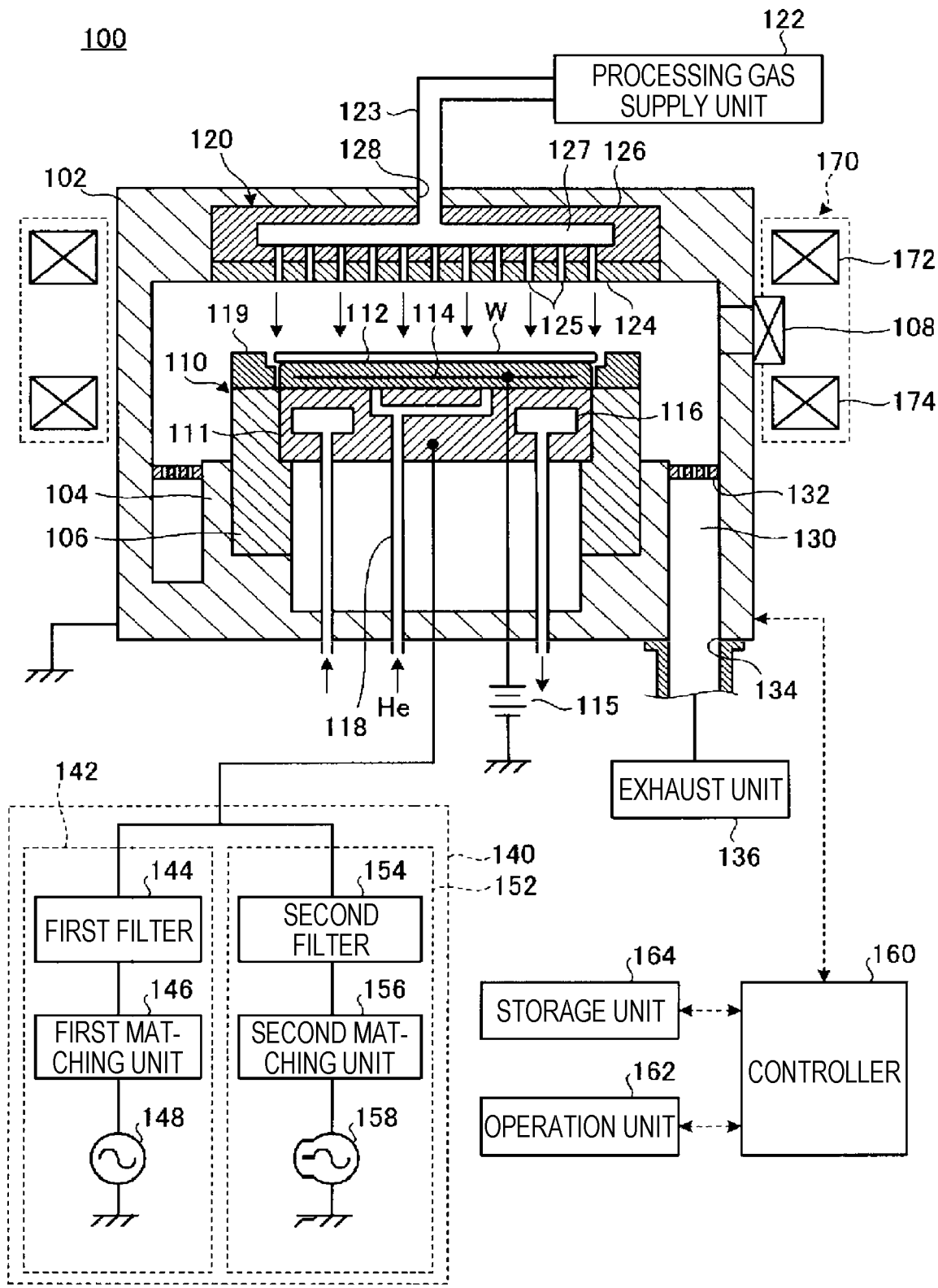
FIG. 1 is a cross-sectional view illustrating a schematic configuration of a plasma processing apparatus according to an embodiment of the present disclosure.

MHz and a second radio-frequency power having a relatively low frequency of, for example, 13.56 MHz to one electrode (lower electrode) will be described as an example. FIG. 1 is a sectional view illustrating a schematic configuration of a plasma processing apparatus 100 according to the present embodiment.

As illustrated in FIG. 1, the plasma processing apparatus 100 includes a processing container (chamber) 102 formed into a cylindrical shape, for example, made of metal such as aluminum or stainless steel whose surface is anodized (alumite-treated). The processing container 102 is grounded. A placing table 110 for placing a semiconductor wafer (hereinafter, simply referred to as a "wafer") W as a substrate to be processed is provided in the processing container 102. The placing table 110 has an electrostatic chuck 112 that holds the wafer W by an electrostatic attraction force and a disc-shape lower electrode (susceptor) 111 that holds the electrostatic chuck 112. The lower electrode 111 is made of, for example, aluminum. The lower electrode 111 is held in a cylindrical portion 104 that extends vertically upward from a bottom portion of the processing container 102 via an insulating cylindrical holding portion 106. An upper electrode 120 also serving as a shower head that introduces, for example, a processing gas or a purge gas is arranged above the lower electrode 111 to face each other.

The electrostatic chuck 112 is provided on a top surface of the lower electrode 111 to hold the wafer W by the electrostatic attraction force. The electrostatic chuck 112 is constituted by, for example, inserting an electrostatic chuck electrode 114 made of a conductive film into an insulating film. The insulating film is made of, for example, alumina ($Al_2O_3$). The electrostatic chuck electrode 114 is electrically connected with a DC power source 115. The wafer W is attracted to the electrostatic chuck 112 by the Coulomb force by applying a DC voltage from the DC power source 115 to the electrostatic chuck electrode 114. The wafer W is placed on the top surface of the electrostatic chuck 112. Hereinafter, the top surface of the electrostatic chuck 112 will be appropriately referred to as a "placing surface of the placing table 110." A silicon oxide film that serves as a protective film against plasma is formed on the top surface (that is, the placing surface of the placing table 110) of the electrostatic chuck 112. The placing table 110 is an example of a member having the silicon oxide film formed on its surface.

A cooling mechanism is provided inside the lower electrode 111. The cooling mechanism is configured to circulate and supply a coolant (e.g., cooling water) of a predetermined temperature from a chiller unit (not illustrated) to a coolant chamber 116 that extends in a circumferential direction in the lower electrode 111 via a pipe. A processing temperature of the wafer W on the electrostatic chuck 112 may be controlled by the temperature of the coolant.

The lower electrode 111 and the electrostatic chuck 112 are provided with a heat transfer gas supply line 118 that is arranged to face a back surface of the wafer W. A heat transfer gas (back gas), for example, He gas is introduced into the heat transfer gas supply line 118, and is supplied between the top surface of the electrostatic chuck 112 and the back surface of the wafer W. Therefore, the heat transfer between the lower electrode 111 and the wafer W is promoted. A focus ring 119 is arranged to surround the periphery of the wafer W placed on the electrostatic chuck 112. The focus ring 119 is made of, for example, quartz or silicon, and is provided on the top surface of the cylindrical holding portion 106.

The upper electrode 120 is provided on a ceiling portion of the processing container 102. The upper electrode 120 is grounded. A processing gas supply unit 122 that supplies a gas necessary for processings in the processing container 102 is connected with the upper electrode 120 via a pipe 123. The processing gas supply unit 122 is constituted by, for example, a gas supply source that supplies, for example, a processing gas or a purge gas necessary for, for example, a process processing of wafers in the processing container 102 or a cleaning processing in the processing container 102.

The upper electrode 120 includes a lower electrode plate 124 having a number of gas vent holes 125 and an electrode support body 126 that detachably supports the electrode plate 124. A buffer chamber 127 is provided inside the electrode support body 126. A gas introduction port 128 of the buffer chamber 127 is connected with a pipe 123 of the processing gas supply unit 122.

In FIG. 1, to simplify the description, the processing gas supply unit 122 is represented by one system of gas lines. However, the processing gas supply unit 122 is not limited to the case of supplying the processing gas of a single gas type, and may supply a plurality of gas species as processing gases. In this case, a plurality of gas supply sources may be provided to constitute a plurality of systems of gas lines, and a mass flow controller may be provided in each gas line.

An exhaust passage 130 is formed between the side wall of the processing container 102 and the cylindrical portion 104. An annular baffle plate 132 is disposed at the inlet or midway of the exhaust passage 14, and an exhaust port 134 is provided at the bottom of the exhaust passage 130. The exhaust port 134 is connected with an exhaust unit 136 via an exhaust pipe. The exhaust unit 136 includes, for example, a vacuum pump, and is configured to depressurize the interior of the processing container 102 to a predetermined vacuum degree. Furthermore, a gate valve 108 is attached to the side wall of the processing container 102 to open and close the carry-in/out port for the wafer W.

The lower electrode 111 is connected with a power supply device 140 that supplies dual frequency superimposed power. The power supply device 140 includes a first radio-frequency power supply mechanism 142 that supplies a first radio-frequency power having a first frequency, and a second radio-frequency power supply mechanism 152 that supplies a second radio-frequency power having a second frequency lower than the first frequency. The first radio-frequency power is a radio-frequency power for generating plasma, and the second radio-frequency power is a radio-frequency power (bias power) for drawing ions into the wafer W.

The first radio-frequency power supply mechanism 142 includes a first filter 144, a first matching unit 146, and a first power source 148 which are sequentially connected from the lower electrode 111. The first filter 144 prevents power component of the second frequency from entering to the first matching unit 146 side. The first matching unit 146 matches a first radio-frequency power component.

The second radio-frequency power supply mechanism 152 includes a second filter 154, a second matching unit 156, and a second power source 158 which are sequentially connected from the lower electrode 111. The second filter 154 prevents power component of the first frequency from entering to the second matching unit 156 side. The second matching unit 156 matches a second radio-frequency power component.

A magnetic field forming portion 170 is placed to surround the periphery of the processing container 102. The magnetic field forming portion 170 includes an upper magnet ring 172 and a lower magnet ring 174 arranged to be vertically apart along the periphery of the processing container 102, and generates a cusp magnetic field surrounding a plasma processing space in the processing container 102.

The plasma processing apparatus 100 is connected with the controller (overall control device) 160, and each part of the plasma processing apparatus 100 is controlled by the controller 160. Further, the controller 160 is connected with an operation unit 162 including, for example, a keyboard through which an operator performs an input operation of a command to manage the plasma processing apparatus 100, and a display that visually displays the operation state of the plasma processing apparatus 100. The controller 160 is implemented by, for example, a central processing unit (CPU).

The controller 160 is connected with a storage unit 164 that stores, for example, a program for implementing various processings (e.g., plasma processing for the wafer W) performed by the plasma processing apparatus 100 under the control of the controller 160 or processing conditions (recipes) necessary for executing the program.

For example, a plurality of processing conditions (recipes) are stored in the storage unit 164. Each of the processing conditions are those obtained by organizing a plurality of parameter values such as control parameters for controlling each part of the plasma processing apparatus 100 and setting parameters. Each of the processing conditions has parameter values such as a processing gas flow rate ratio, a pressure in the processing container, and a radio-frequency power.

These programs or processing conditions may be stored in a hard disk or a semiconductor memory, or may be set in a predetermined position of the storage unit 164 while being stored in a storage medium readable by a portable computer such as a CD-ROM or a DVD.

The controller 160 reads a desired program or a processing condition from the storage unit 164 based on, for example, an instruction from the operation unit 162 and controls each part, so as to execute a desired processing in the plasma processing apparatus 100. Further, the processing conditions may be edited by an operation from the operation unit 162.

(Cleaning Processing of Plasma Processing Apparatus)

Figure 2:
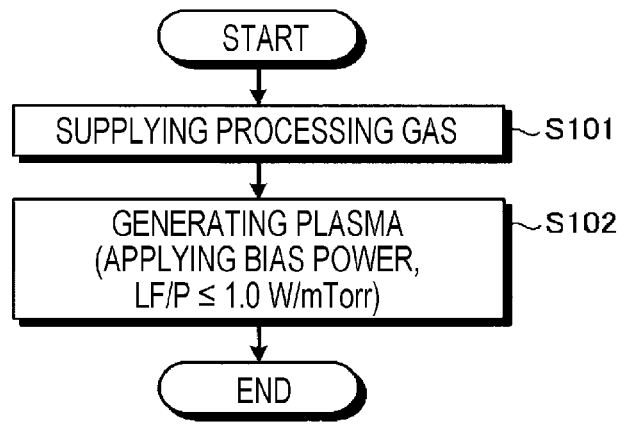
FIG. 2 is a flowchart illustrating an example of a cleaning processing by a plasma processing apparatus according to an embodiment of the present disclosure.

FIG. 2 is a flowchart illustrating an example of a cleaning processing by the plasma processing apparatus 100 according to an embodiment of the present disclosure. The cleaning processing illustrated in FIG. 2 is performed in a state where the wafer W is not placed on the placing surface of the placing table 110. As illustrated in FIG. 2, the controller 160 of the plasma processing apparatus 100 controls the processing gas supply unit 122 so as to supply the processing gas into the processing container 102 (stage S101). The processing gas is, for example, a mixed gas containing a fluorine-containing gas and an oxygen-containing gas. The fluorine-containing gas is, for example, at least one of $NF_3$, $SF_6$, and $CF_4$. The oxygen-containing gas is, for example, $O_2$. Further, a rare gas may also be added to the mixed gas. The rare gas is, for example, Ar.

Subsequently, the controller 160 controls the power supply device 140 to generate plasma of the processing gas supplied into the processing container 102 (stage S102). Specifically, the controller 160 controls the power supply device 140 to supply the first radio-frequency power from the first radio-frequency power supply mechanism 142 to the placing table 110 (lower electrode 111). Further, when the first radio-frequency power is supplied, the controller 160 controls the power supply device 140 to supply the second radio-frequency power (bias power) from the second radio-frequency power supply mechanism 152 to the placing table 110 (lower electrode 111). The plasma of the processing gas is generated by the supply of the first radio-frequency power, and ions in the plasma of the processing gas is drawn to a surface (that is, top surface of the electrostatic chuck 112) of the placing table 110 by the supply of the second radio-frequency power. In this manner, the silicon oxide film serving as a protective film is removed from the surface (that is, top surface of the electrostatic chuck 112) of the placing table 110.

Further, when the plasma of the processing gas is generated, a ratio of a value of the bias power to the pressure in the processing container 102 is 1.0 W/mTorr or less. In this manner, the energy of the ions drawn to the surface (that is, top surface of the electrostatic chuck 112) of the placing table 110 is reduced. Therefore, damage given by the plasma to the surface (that is, top surface of the electrostatic chuck 112) of the placing table 110 disposed below the silicon oxide film is reduced, and the silicon oxide film is appropriately removed. For example, it is assumed that the processing gas is a mixed gas containing a fluorine-containing gas and an oxygen-containing gas. In this case, degree of fluorination of the surface (that is, top surface of the electrostatic chuck 112) of the placing table 110 disposed below the silicon oxide film by the plasma of the fluorine-containing gas is reduced, and the silicon oxide film is appropriately removed.

Here, descriptions will be made on an experiment confirming that the damage given by the plasma to the top surface of the electrostatic chuck 112 depends on the ratio of the value of the bias power to the pressure in the processing container 102, with reference to FIG. 3.

Figure 3:
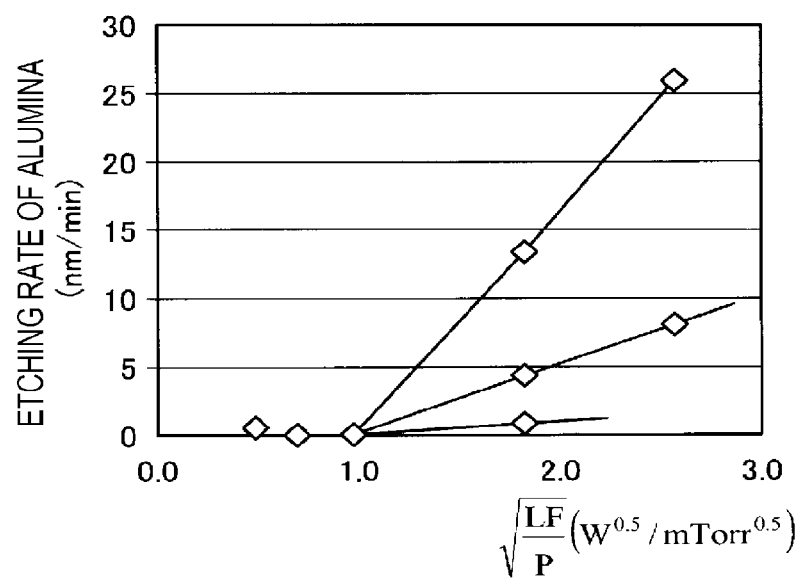
FIG. 3 is a view illustrating a change in an etching rate of a top surface of an electrostatic chuck in a case where a ratio of a value LF of a bias power to a pressure P in a processing container is changed.

FIG. 3 is a view illustrating a change in an etching rate of the top surface of the electrostatic chuck 112 in a case where the ratio of the value LF of the bias power to the pressure P in the processing container 102 is changed. In the experiment illustrated in FIG. 3, a test piece made of alumina was placed on the top surface of the electrostatic chuck 112, plasma of the processing gas was generated under the following processing conditions, and an etching rate of alumina was measured as the etching rate of the top surface of the electrostatic chuck 112. The horizontal axis in FIG. 3 illustrates the ratio of the value LF of the bias power to the pressure P in the processing container 102 in a square root form.

The experiment illustrated in FIG. 3 was performed under the following conditions.

Pressure in processing container 102: 30 mTorr to 400 mTorr

First radio-frequency power/Second radio-frequency power (bias power):

600 to 2,400/0 to 200 W

Processing gas and Flow rate thereof: $NF_3/O_2/Ar$=300 to 560/30 to 560/0 to 560 sccm, $SF_6/O_2/Ar$=300 to 560/30 to 560/0 to 560 sccm, or $CF_4/O_2/Ar$=300 to 560/30 to 560/0 to 560 sccm As illustrated in FIG. 3, when the ratio of the value LF of the bias power to the pressure P in the processing container 102 was 1.0 W/mTorr or less, the etching rate of the alumina was small, that is, almost zero, as compared to a case where the ratio is larger than 1.0 W/mTorr. That is, it may be found that the damage given by the plasma of the fluorine-containing gas ($NF_3$, $SF_6$, or $CF_4$) to the top surface of the electrostatic chuck 112 is reduced by setting the ratio of the value LF of the bias power to the pressure P in the processing container 102 to 1.0 W/mTorr or less.

Further, the pressure P may be in a range of 250 mTorr to 400 mTorr, and further, in a range of 300 mTorr to 400 mTorr under the condition that the ratio of value LF of the bias power to the pressure P is 1.0 W/mTorr or less. In this manner, reaction products generated on the surface (that is, top surface of the electrostatic chuck 112) of the placing table 110 below the silicon oxide film are suppressed from being detached from the surface of the placing table 110, and thus, deterioration of the roughness (Ra) of the surface of the placing table 110 is suppressed. For example, it is assumed that the top surface of the electrostatic chuck 112 is made of alumina ($Al_2O_3$). In this case, fluorination falls only in the outermost surface layer since $Al_2F_3$ generated by fluorination of the surface (that is, top surface of the electrostatic chuck 112) of the placing table 110 by the plasma of the fluorine-containing gas is suppressed from detaching from the top surface of the electrostatic chuck 112. Therefore, the deterioration of the roughness (Ra) of the surface (top surface of the electrostatic chuck 112) of the placing table 110 is suppressed.

Here, descriptions will be made on experiments confirming that the damage caused by the plasma to the top surface of the electrostatic chuck 112 depends on the pressure in the processing container 102, with reference to FIGS. 4A to 4C.

Figure 4A:
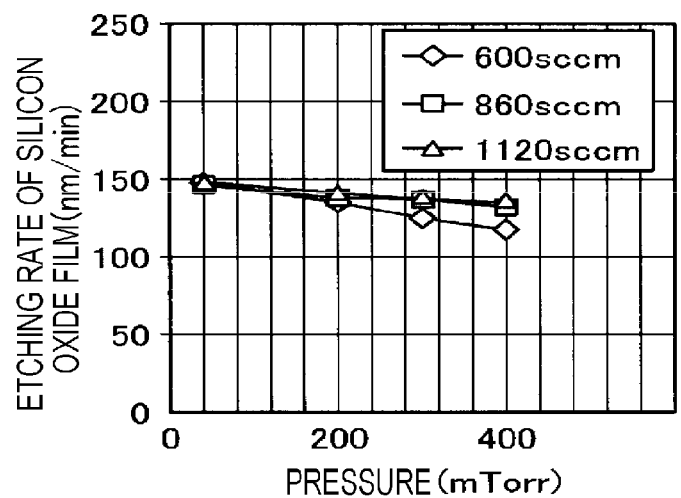
FIGS. 4A to 4C are views illustrating a change of an etching rate of a silicon oxide film, the change of the etching rate of the top surface of the electrostatic chuck, and a change of roughness (Ra) of the top surface of the electrostatic chuck, in a case where the pressure in the processing container is changed.
Figure 4B:
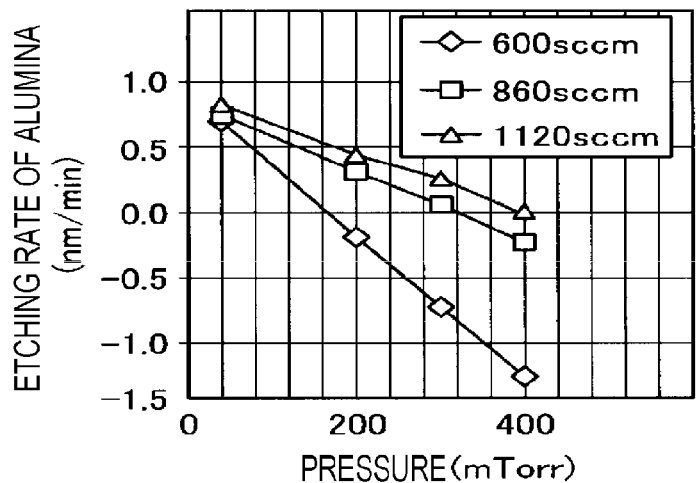
Figure 4C:
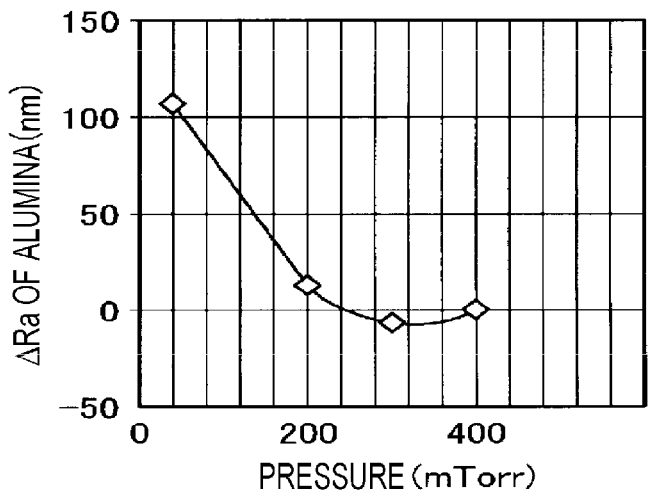

FIGS. 4A to 4C are views illustrating a change of the etching rate of the silicon oxide film, the change of the etching rate of the top surface of the electrostatic chuck 112, and the change of the roughness (Ra) of the top surface of the electrostatic chuck 112, in a case where the pressure in the processing container 102 is changed. In the experiments illustrated in FIGS. 4A to 4C, a test piece made of silicon oxide film was placed on the top surface of the electrostatic chuck 112, plasma of the processing gas was generated under the following processing conditions, and the etching rate of the silicon oxide film was measured. Further, in the experiments illustrated in FIGS. 4A to 4C, a test piece made of alumina was placed on the top surface of the electrostatic chuck 112, plasma of the processing gas was generated under the following processing conditions, and an etching rate of alumina was measured as the etching rate of the top surface of the electrostatic chuck 112. A change amount ($\Delta Ra$) of the roughness (Ra) of the alumina was measured as a change amount ($\Delta Ra$) of the roughness (Ra) of the top surface of the electrostatic chuck 112.

The experiments illustrated in FIGS. 4A to 4C were performed under the following conditions.

Pressure in processing container 102: 30 to 400 mTorr
First radio-frequency power/Second radio-frequency power (bias power): 1500/100 W
Process gas and Flow rate thereof: $NF_3/O_2/Ar$=430/(flow rate at which the total flow rate of the mixed gas is 600 to 1120 sccm)/0 sccm As illustrated in FIGS. 4A to 4C, the etching rate of the alumina was reduced by increasing the pressure in the processing container 102. Further, the etching rate of the silicon oxide film satisfied predetermined allowable specifications, regardless of the change in the pressure in the processing container 102. The change amount ($\Delta Ra$) of the roughness (Ra) of the alumina was 0 nm when the pressure in the processing container 102 was in a range of 250 to 400 mTorr. From these results, it may be found that the damage given by the plasma to the top surface of the electrostatic chuck 112 is reduced when the silicon oxide film is removed by the plasma of the fluorine-containing gas, by setting the pressure in the processing container 102 in the range of 250 to 400.

Further, when the mixed gas containing the fluorine-containing gas and the oxygen-containing gas is used as the processing gas, a ratio of the flow rate of the oxygen-containing gas to the flow rate of the fluorine-containing gas in the mixed gas may be 0.7 or more, and further, 1.0 or more. In this manner, the partial pressure of the fluorine-containing gas in the mixed gas may be reduced, and thus, the damage to the surface (that is, top surface of the electrostatic chuck 112) of the placing table 110 is suppressed.

Figure 5A:
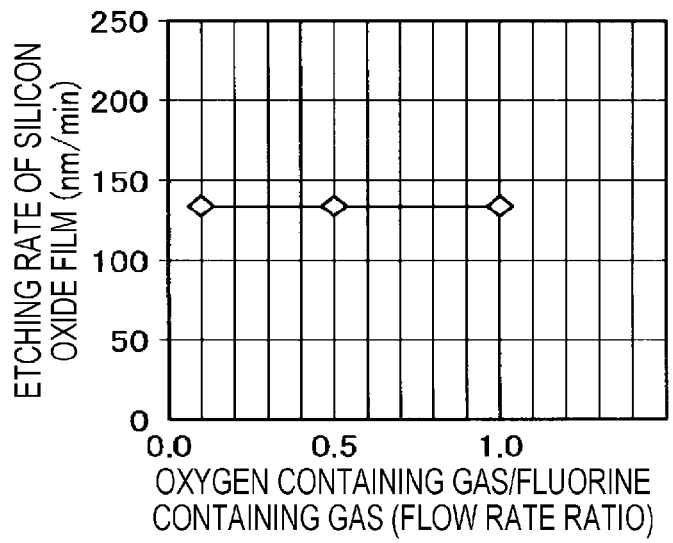
FIGS. 5A to 5C are views illustrating the change of the etching rate of the silicon oxide film, the change of the etching rate of the top surface of the electrostatic chuck, and the change of roughness (Ra) of the top surface of the electrostatic chuck, in a case where, in the mixed gas, a ratio of a flow rate of an oxygen-containing gas to a flow rate of a fluorine-containing gas is changed.
Figure 5B:
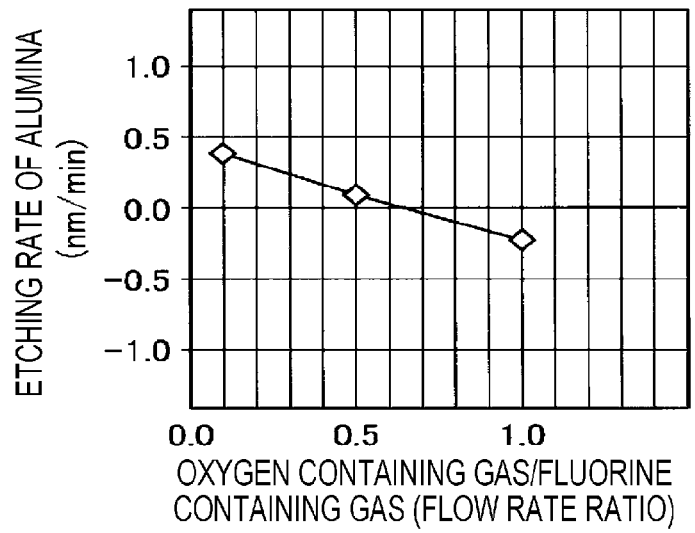
Figure 5C:
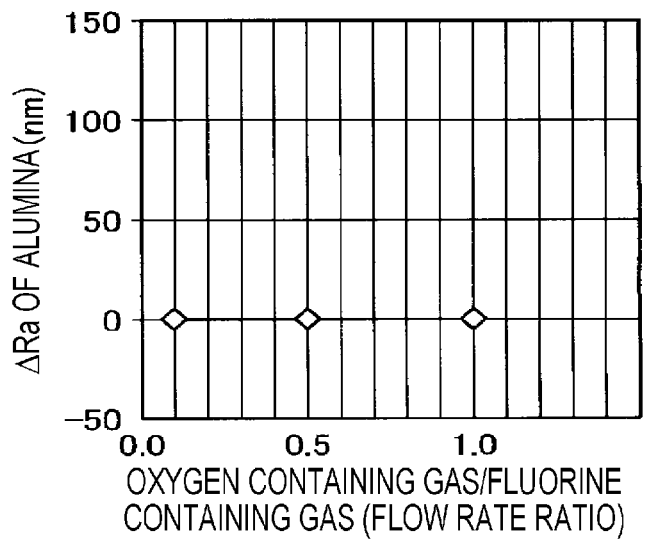

FIGS. 5A to 5C are views illustrating the change of the etching rate of the silicon oxide film, the change of the etching rate of the top surface of the electrostatic chuck 112, and the change of roughness (Ra) of the top surface of the electrostatic chuck 112, in a case where, in the mixed gas, the ratio of the flow rate of the oxygen-containing gas to the flow rate of the fluorine-containing gas is changed. In the experiments illustrated in FIGS. 5A to 5C, a test piece made of silicon oxide film was placed on the top surface of the electrostatic chuck 112, plasma of the processing gas was generated under the following processing conditions, and the etching rate of the silicon oxide film was measured. Further, in the experiments illustrated in FIGS. 5A to 5C, a test piece made of alumina was placed on the top surface of the electrostatic chuck 112, plasma of the processing gas was generated under the following processing conditions, and the etching rate of the alumina was measured as the etching rate of the top surface of the electrostatic chuck 112. A change amount ($\Delta Ra$) of the roughness (Ra) of the alumina was measured as a change amount ($\Delta Ra$) of the roughness (Ra) of the top surface of the electrostatic chuck 112.

The experiments illustrated in FIGS. 5A to 5C were performed under the following conditions.

Pressure in processing container 102: 400 mTorr
First radio-frequency power/Second radio-frequency power (bias power): 1500/100 W
Process gas and Flow rate thereof: $NF_3/O_2/Ar$=430/(flow rate at which a ratio of the flow rate of $O_2$ to the flow rate of $NF_3$ is 0.1 to 1.0 sccm)/0 sccm As illustrated in FIGS. 5A to 5C, the etching rate of the alumina was reduced by increasing the ratio of the flow rate of the oxygen-containing gas to the flow rate of the fluorine-containing gas in the mixed gas. Further, the etching rate of the silicon oxide film satisfied the predetermined allowable specifications, regardless of the change in the ratio of the flow rate of the oxygen-containing gas to the flow rate of the fluorine-containing gas. Further, the change amount ($\Delta Ra$) of the roughness (Ra) of the alumina was maintained substantially 0 nm, regardless of the change of the ratio of the flow rate of the oxygen-containing gas to the flow rate of the fluorine-containing gas. The etching rate of the alumina was 0 nm/min or less when the ratio of the flow rate of the oxygen-containing gas to the flow rate of the fluorine-containing gas was 0.7 or more. From these results, it may be found that the damage given by the plasma of the fluorine-containing gas to the top surface of the electrostatic chuck 112 is reduced by setting the ratio of the flow rate of the oxygen-containing gas to the flow rate of the fluorine-containing gas to 0.7 or more. Further desirably, it may be found that the damage given by the plasma of the fluorine-containing gas to the top surface of the electrostatic chuck 112 is further reduced by setting the ratio of the flow rate of the oxygen-containing gas to the flow rate of the fluorine-containing gas to 1.0 or more.

Further, the total flow rate of the mixed gas may be selected depending on the pressure in the processing container 2 when the plasma of the mixed gas containing the fluorine-containing gas and the oxygen-containing gas is generated as the plasma of the processing gas. The total flow rate of the mixed gas may be 710 sccm or less when the pressure in the processing container 102 is 250 mTorr.

Further, the total flow rate of the mixed gas may be 860 sccm or less when the pressure in the processing container 102 is 300 mTorr. Further, the total flow rate of the mixed gas may be 1,000 sccm or less when the pressure in the processing container 102 is 350 mTorr. Further, the total flow rate of the mixed gas may be 1,140 sccm or less when the pressure in the processing container 102 is 400 mTorr. In this manner, $Al_2F_3$ generated by fluorination of the surface (that is, top surface of the electrostatic chuck 112) of the placing table 110 by the plasma of the fluorine-containing gas is suppressed from detaching from the top surface of the electrostatic chuck 112. Therefore, the damage given by the plasma of the fluorine-containing gas to the top surface of the electrostatic chuck 112 is suppressed.

Here, descriptions will be made on experiments confirming that the damage given by the plasma to the top surface of the electrostatic chuck 112 depends on the total flow rate of the mixed gas, with reference to FIGS. 6A to 6C.

Figure 6A:
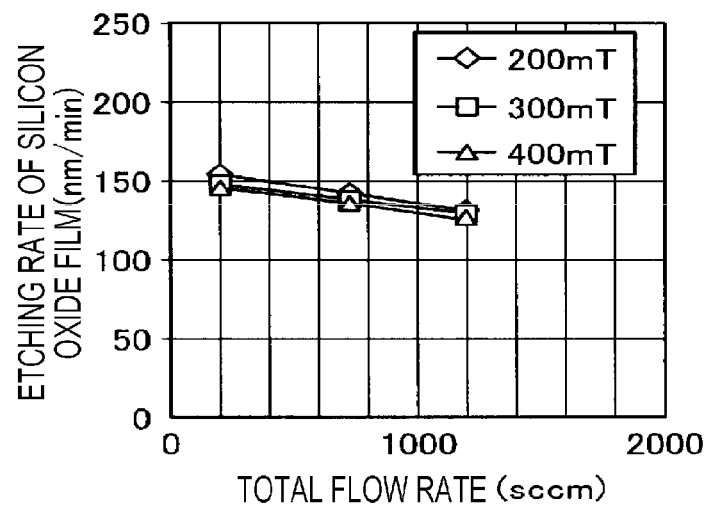
FIGS. 6A to 6C are views illustrating the change of the etching rate of the silicon oxide film, the change of the etching rate of the top surface of the electrostatic chuck, and the change of roughness (Ra) of the top surface of the electrostatic chuck, in a case where a total flow rate of the mixed gas is changed.
Figure 6B:
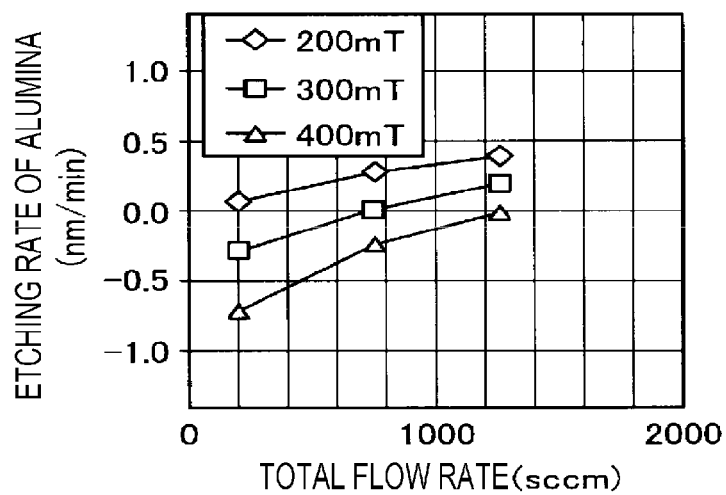
Figure 6C:
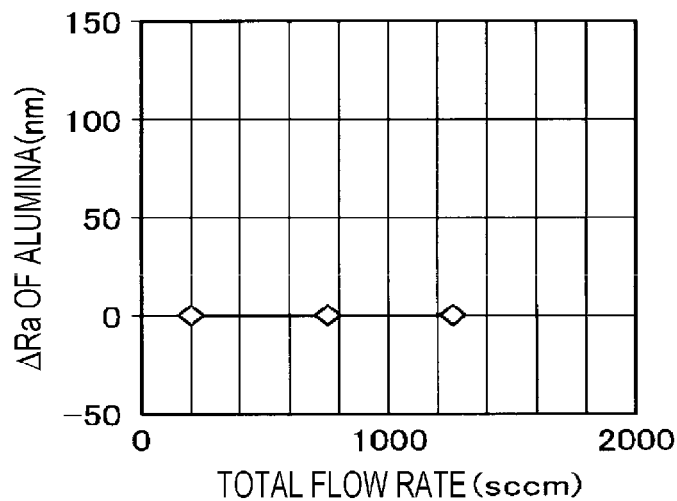

FIGS. 6A to 6C are views illustrating the change of the etching rate of the silicon oxide film, the change of the etching rate of the top surface of the electrostatic chuck 112, and the change of roughness (Ra) of the top surface of the electrostatic chuck 112, in a case where the total flow rate of the mixed gas is changed. In the experiments illustrated in FIGS. 6A to 6C, a test piece made of silicon oxide film was placed on the top surface of the electrostatic chuck 112, plasma of the processing gas was generated under the following processing conditions, and the etching rate of the silicon oxide film was measured. Further, in the experiments illustrated in FIGS. 6A to 6C, a test piece made of alumina was placed on the top surface of the electrostatic chuck 112, plasma of the processing gas was generated under the following processing conditions, and the etching rate of the alumina was measured as the etching rate of the top surface of the electrostatic chuck 112. A change amount (ΔRa) of the roughness (Ra) of the alumina was measured as a change amount (ΔRa) of the roughness (Ra) of the top surface of the electrostatic chuck 112.

The experiments illustrated in FIGS. 6A to 6C were performed under the following conditions.

Pressure in processing container 102: 200 to 400 mTorr
First radio-frequency power/Second radio-frequency power (bias power): 1500/100 W
Process gas and Flow rate thereof: $NF_3/O_2/Ar$=430/(flow rate at which the total flow rate of the mixed gas is 200 to 1200 sccm)/0 sccm As illustrated in FIGS. 6A to 6C, the etching rate of the alumina was reduced by decreasing the total flow rate of the mixed gas. Further, the etching rate of the silicon oxide film satisfied predetermined allowable specifications, regardless of the change in the total flow rate of the mixed gas. Further, the change amount (ΔRa) of the roughness (Ra) of the alumina was maintained 0 nm, regardless of the change of the total flow rate of the mixed gas.

Figure 7:
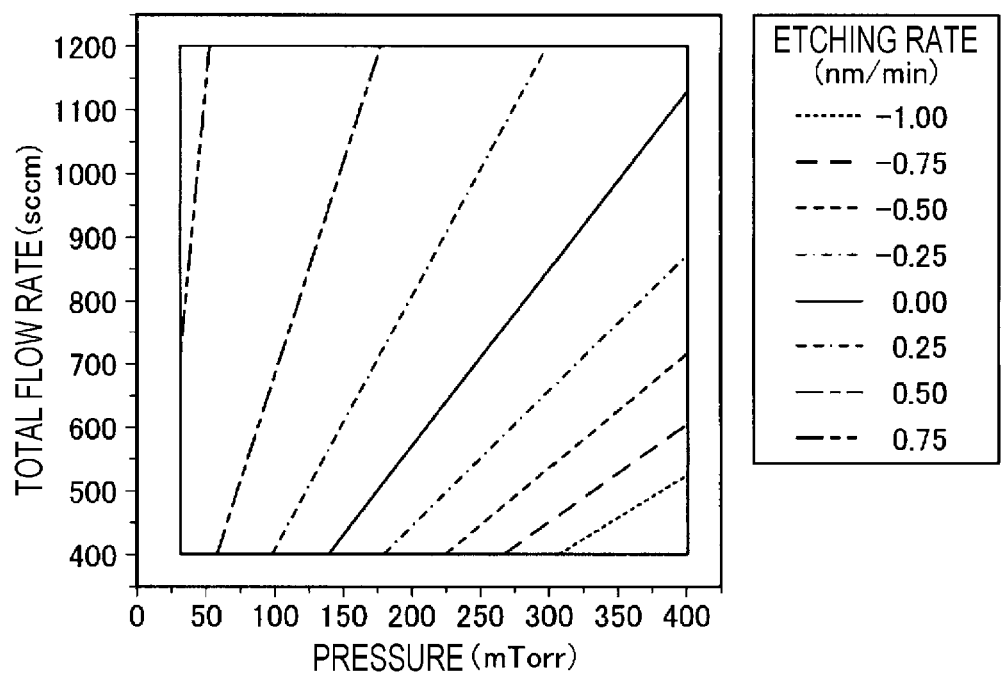
FIG. 7 is a contour view illustrating a relationship among an etching rate of alumina, the pressure in the processing container, and the total flow rate of the mixed gas.

The present inventor further analyzed the etching rate of the alumina based on the results of the experiments illustrated in FIGS. 6A to 6C. That is, the present inventor analyzed the etching rate of the alumina with the multiple regression analysis using the pressure in the processing container 102 and the total flow rate of the mixed gas. Therefore, it may be found that the etching rate of the alumina is a linear function of the residence time of the mixed gas. The residence time is proportional to (the pressure in the processing container 102)/(the total flow rate of the mixed gas). FIG. 7 illustrates a contour view illustrating a relationship among the etching rate of the alumina, the pressure in the processing container 102, and the total flow rate of the mixed gas obtained by using the regression equation of the residence time and the etching rate of the alumina. A situation is illustrated in the contour view illustrated in FIG. 7, in which the etching rate of the alumina decreases as the pressure in the processing container 102 increases, and the etching rate of the alumina increases as the total flow rate of the mixed gas increases.

Figure 8:
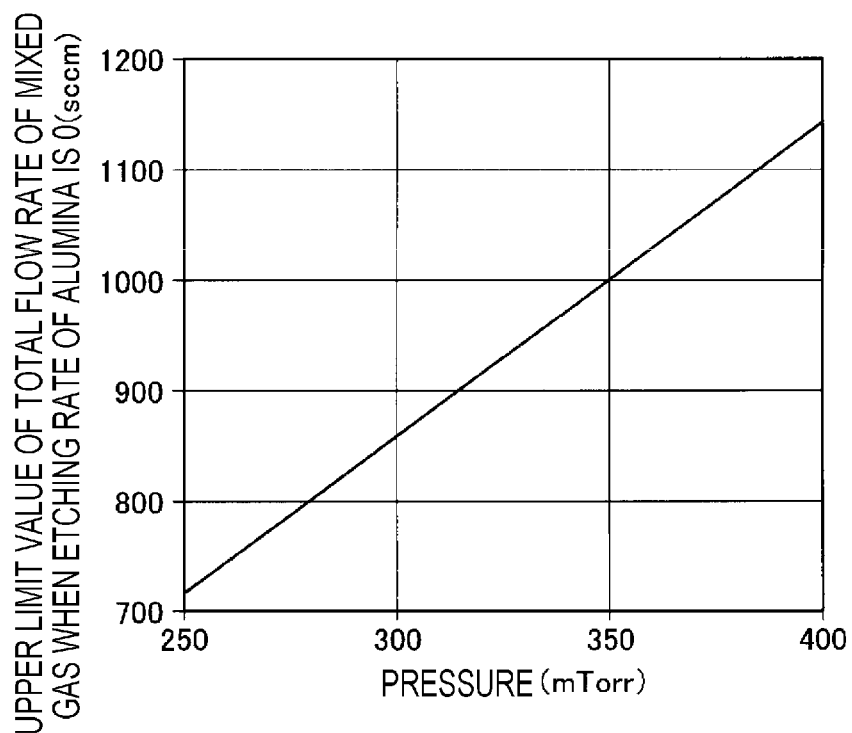
FIG. 8 is a view illustrating an example of a relationship between "an upper limit value of the total flow rate of the mixed gas in a case where the etching rate of the alumina is 0" obtained from the contour view illustrated in FIG. 7, and the pressure of the processing container.

FIG. 8 is a view illustrating an example of a relationship between "an upper limit value of the total flow rate of the mixed gas in a case where the etching rate of the alumina is 0" obtained from the contour view illustrated in FIG. 7, and the pressure of the processing container 102. As described above, the change amount (ΔRa) of the roughness (Ra) of the alumina becomes 0 nm when the pressure in the processing container 102 is in the range of 250 mTorr to 400 mTorr. From FIG. 8, it can be seen that the total flow rate of the mixed gas may be selected depending on the pressure in the processing container 102 in order to suppress the change amount (ΔRa) of the roughness (Ra) of the alumina and the etching rate of the alumina. That is, the total flow rate of the mixed gas may be 710 sccm or less when the pressure in the processing container 102 is 250 mTorr. Further, the total flow rate of the mixed gas may be 860 sccm or less when the pressure in the processing container 102 is 300 mTorr. Further, the total flow rate of the mixed gas may be 1,000 sccm or less when the pressure in the processing container 102 is 350 mTorr. Further, the total flow rate of the mixed gas may be 1,140 sccm or less when the pressure in the processing container 102 is 400 mTorr.

As described above, according to an embodiment, when the silicon oxide film is removed from the placing table 110 by plasma, the bias power is applied to the placing table 110, and the value of the bias power to the pressure in the processing container 102 is set to 1.0 W/mTorr. In this manner, the energy of the ions drawn to the surface (that is, top surface of the electrostatic chuck 112) of the placing table 110 is reduced. Therefore, it is possible to appropriately remove the silicon oxide film while reducing the damage given by the plasma to the surface (that is, top surface of the electrostatic chuck 112) of the placing table 110 disposed below the silicon oxide film as much as possible.

Other Embodiment

The cleaning method and the plasma processing apparatus according to an embodiment have been described, but the present disclosure is not limited thereto. Hereinafter, other exemplary embodiments will be described.

In the embodiment described above, an example that performs the cleaning processing in which the silicon oxide film is removed from the placing table 110 by plasma, but, a member to be subjected to the cleaning processing is not limited to the placing table 110. For example, the cleaning processing according to the present embodiment may be applied equally to other members provided in the processing container 102 and having a silicon oxide film on a surface thereof. For example, the inner wall of the processing container 102 may be assumed as other members having the silicon oxide film on a surface thereof. In this case, the bias power is applied to the inner wall of the processing container 102.

Further, the plasma processing apparatus according to the present embodiment is a plasma processing apparatus using a capacitively coupled plasma (CCP), but an arbitrary plasma source may be applied to the plasma processing apparatus. For example, inductively coupled plasma (ICP), radial line slot antenna (RLSA), electron cyclotron resonance plasma (ECR), and helicon wave plasma (HWP) may be applied to the plasma processing apparatus as a plasma source.

According to an aspect of the disclosed cleaning method, the silicon oxide film may be appropriately removed from the member provided in the processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning method comprising:
   etching a substrate in a processing container of a plasma processing apparatus, the processing container including a member having a silicon oxide film formed on its surface;
   after the substrate where the etching has been performed is carried out from the processing container, supplying a processing gas into the processing container;
   generating plasma from the processing gas that is supplied into the processing container; and
   applying bias power that draws ions in the plasma of the processing gas to the member of the processing container in order to remove the silicon oxide from the surface of the member of the processing container, the bias power having a frequency lower than a frequency of a plasma power,
   wherein, in the generating plasma and the applying bias power, a ratio of a value of the bias power to a pressure in the processing container is 1.0 W/mTorr or less.

2. The cleaning method of claim 1, wherein the pressure in the processing container is in a range of 250 mTorr to 400 mTorr.

3. The cleaning method of claim 2, wherein the processing gas is a mixed gas containing a fluorine-containing gas and an oxygen-containing gas, and
   in the mixed gas, a ratio of a flow rate of the oxygen-containing gas to a flow rate of the fluorine-containing gas is 0.7 or more.

4. The cleaning method of claim 3, wherein a total flow rate of the mixed gas is 710 sccm or less when the pressure in the processing container is 250 mTorr.

5. The cleaning method of claim 3, wherein a total flow rate of the mixed gas is 860 sccm or less when the pressure in the processing container is 300 mTorr.

6. The cleaning method of claim 3, wherein a total flow rate of the mixed gas is 1,000 sccm or less when the pressure in the processing container is 350 mTorr.

7. The cleaning method of claim 3, wherein a total flow rate of the mixed gas is 1,140 sccm or less when the pressure in the processing container is 400 mTorr.

8. The cleaning method of claim 2, wherein the member is a placing table having a placing surface on which the substrate to be processed is placed, and
   the silicon oxide film is formed on the placing surface of the placing table.

9. The cleaning method of claim 1, wherein the processing gas is a mixed gas containing a fluorine-containing gas and an oxygen-containing gas, and
   in the mixed gas, a ratio of a flow rate of the oxygen-containing gas to a flow rate of the fluorine-containing gas is 0.7 or more.

10. The cleaning method of claim 9, wherein a total flow rate of the mixed gas is 710 sccm or less when the pressure in the processing container is 250 mTorr.

11. The cleaning method of claim 9, wherein a total flow rate of the mixed gas is 860 sccm or less when the pressure in the processing container is 300 mTorr.

12. The cleaning method of claim 9, wherein a total flow rate of the mixed gas is 1,000 sccm or less when the pressure in the processing container is 350 mTorr.

13. The cleaning method of claim 9, wherein a total flow rate of the mixed gas is 1,140 sccm or less when the pressure in the processing container is 400 mTorr.

14. The cleaning method of claim 1, wherein the member is a placing table having a placing surface on which the substrate to be processed is placed, and
   the silicon oxide film is formed on the placing surface of the placing table.

15. The cleaning method of claim 1, wherein:
   the bias power is applied at a lower power amount than the plasma power,
   the pressure in the processing container is in a range of 250 mTorr to 400 mTorr, and
   the processing gas is a mixed gas comprising a fluorine-containing gas and an oxygen containing gas, with a ratio of a flow rate of oxygen-containing gas to a flow rate of fluorine containing gas 0.7 or more.

* * * * *